(12) United States Patent
Nishida et al.

(10) Patent No.: US 10,431,322 B1
(45) Date of Patent: Oct. 1, 2019

(54) MEMORY SYSTEM

(71) Applicant: Toshiba Memory Corporation, Minato-ku (JP)

(72) Inventors: Hiroki Nishida, Kamakura (JP); Hidetaka Tsuji, Yokohama (JP); Tomoyuki Kantani, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/050,386

(22) Filed: Jul. 31, 2018

(30) Foreign Application Priority Data

Mar. 19, 2018 (JP) .................................. 2018-050380

(51) Int. Cl.
| | | |
|---|---|---|
| *G11C 29/50* | (2006.01) | |
| *G11C 16/26* | (2006.01) | |
| *G11C 16/10* | (2006.01) | |
| *G11C 29/12* | (2006.01) | |
| *G11C 16/34* | (2006.01) | |

(52) U.S. Cl.
CPC ........ *G11C 29/50004* (2013.01); *G11C 16/10* (2013.01); *G11C 16/26* (2013.01); *G11C 29/12005* (2013.01); *G11C 16/34* (2013.01); *G11C 16/3418* (2013.01); *G11C 16/3427* (2013.01)

(58) Field of Classification Search
CPC ........ G11C 29/50004; G11C 29/12005; G11C 16/26; G11C 16/10; G11C 16/0483; G11C 16/34; G11C 16/3418; G11C 16/3427

USPC .... 365/185.09, 185.17, 185.22, 201, 189.04, 365/200

See application file for complete search history.

(56) References Cited

U.S. PATENT DOCUMENTS

| | | | |
|---|---|---|---|
| 7,558,120 B2 | 7/2009 | Takai | |
| 2012/0254518 A1 | 10/2012 | Komatsu | |
| 2013/0258776 A1* | 10/2013 | Nagadomi | G11C 16/26 365/185.11 |
| 2014/0085982 A1* | 3/2014 | Asaoka | G11C 16/06 365/185.17 |
| 2015/0262698 A1* | 9/2015 | Shirakawa | G11C 16/3445 365/185.11 |
| 2016/0267980 A1* | 9/2016 | Akamine | G11C 16/0483 |

FOREIGN PATENT DOCUMENTS

| | | |
|---|---|---|
| JP | 2008-192240 | 8/2008 |
| JP | 4921953 | 4/2012 |
| JP | 2012-203957 | 10/2012 |
| JP | 2012-212487 | 11/2012 |

* cited by examiner

*Primary Examiner* — Tan T. Nguyen
(74) *Attorney, Agent, or Firm* — Oblon, McClelland, Maier & Neustadt, L.L.P.

(57) ABSTRACT

According to one embodiment, a first string is coupled to the bit line via a first transistor and includes a first cell transistor. A second string is coupled to the bit line via a second transistor and includes a second cell transistor. The first and second cell transistors are coupled to the word line. A controller is configured to instruct the memory device to write first data to the first cell transistor and to write second data to the second cell transistor. The controller is further configured to instruct the memory device to read data from the first cell transistor while storing the first data and the second data after making the instruction for writing the first data and the second data.

16 Claims, 15 Drawing Sheets

US 10,431,322 B1

MEMORY SYSTEM

CROSS-REFERENCE TO RELATED APPLICATIONS

This application is based upon and claims the benefit of priority from Japanese Patent Application No. 2018-50380, filed Mar. 19, 2018, the entire contents of which are incorporated herein by reference.

FIELD

Embodiments relate generally to a memory system.

BACKGROUND

A memory system including a semiconductor memory device and a controller that controls the semiconductor memory device is known.

DETAILED DESCRIPTION

Figure 1:
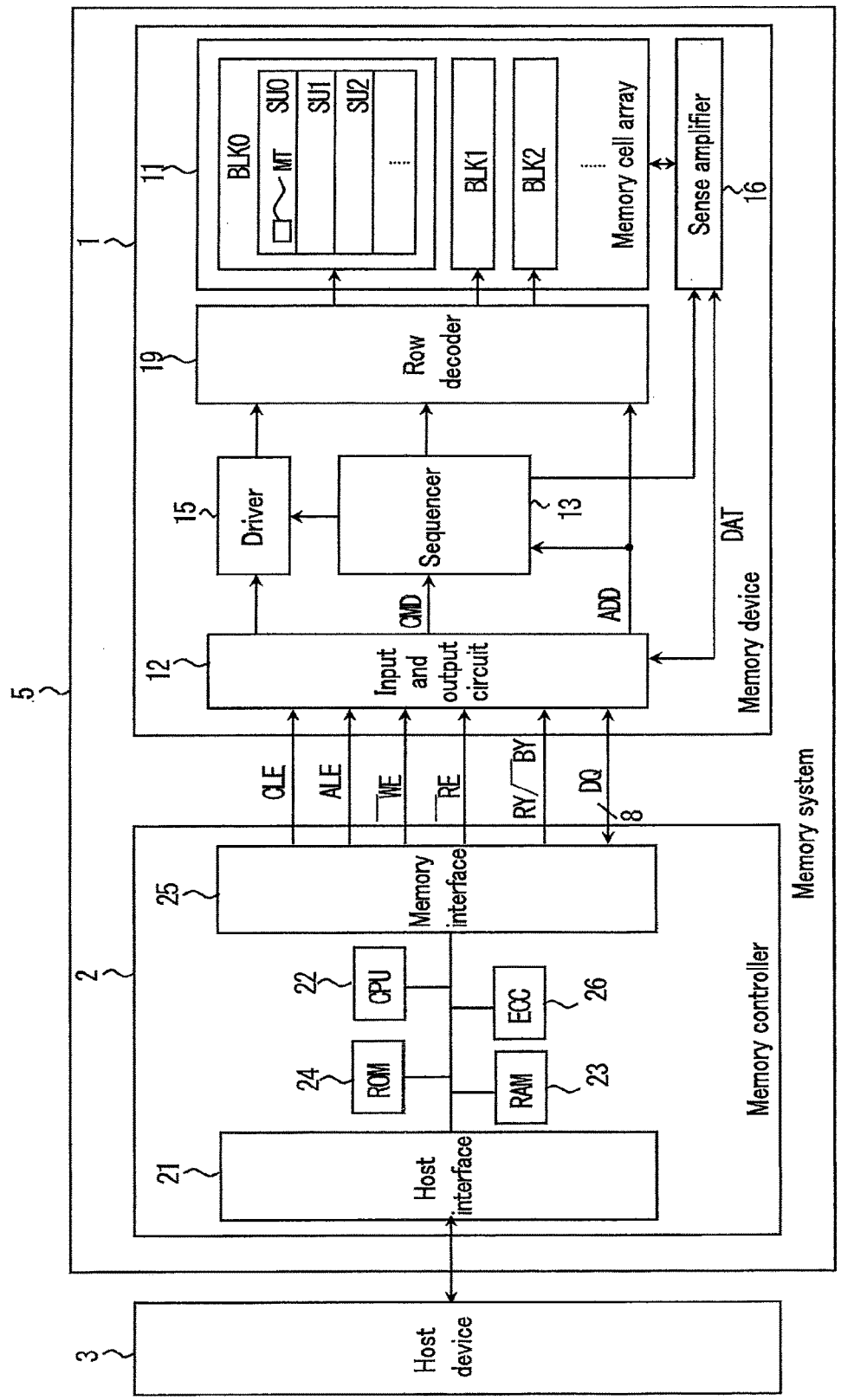
FIG. 1 illustrates components and connections in a memory system according to a first embodiment and related components.

According to one embodiment, a memory system includes a memory device and a controller. The memory device includes a bit line; a word line; a first string coupled to the bit line via a first transistor and including a first cell transistor; and a second string coupled to the bit line via a second transistor and including a second cell transistor. The second cell transistor and the first cell transistor are coupled to the word line. The controller is configured to instruct the memory device to write first data to the first cell transistor and to write second data to the second cell transistor. The controller is further configured to instruct the memory device to read data from the first cell transistor while storing the first data and the second data after making the instruction for writing the first data and the second data.

Embodiments will now be described with reference to the figures. In the following description, components with substantially the same functionalities and configurations will be referred to with the same reference numerals, and repeated descriptions may be omitted. Moreover, the entire description for a particular embodiment also applies to another embodiment unless it is explicitly mentioned otherwise or obviously eliminated.

Each functional block can be implemented as hardware, computer software, or combination of the both. It is not necessary that functional blocks are distinguished as in the following examples. For example, some of the functions may be implemented by functional blocks different from those illustrated below.

Furthermore, an illustrated functional block may be divided into functional sub-blocks.

Moreover, any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

First Embodiment

<1. Structure (Configuration)>

FIG. 1 illustrates components and connections in a memory system according to a first embodiment and related components. As illustrated in FIG. 1, a memory system 5 is controlled by a host device 3, and includes a semiconductor memory device 1 and a memory controller 2. Examples of the memory system 5 may include a solid state drive (SSD) and an SD (trademark) card.

The memory device 1 is controlled by the memory controller 2. The memory controller 2 receives instructions from the host device 3, and controls the memory device 1 based on the received instructions.

<1.1. Memory Controller>

The memory controller 2 includes a host interface 21, a central processing unit (CPU) 22, a random access memory (RAM) 23, a read only memory (ROM) 24, a memory interface 25, and an error correction code (ECC) circuit 26. A firmware (i.e., program) stored in the ROM 24 and loaded to the RAM 23 is executed by the CPU 22, whereby the memory controller 2 executes various operations and a part of functions of the host interface 21 and the memory interface 25. The RAM 23 further temporarily stores data, and functions as a buffer and a cache.

The host interface 21 is coupled to the host device 3 via a bus, and manages communication between the memory controller 2 and the host device 3. The memory interface 25 is coupled to the memory device 1, and manages communication between the memory controller 2 and the memory device 1.

The ECC circuit 26 executes processing necessary for detecting and correcting an error on data to be written in the memory device 1 and data read from the memory device 1. Specifically, the ECC circuit 26 generates redundant data for correcting an error of the data to be written in the memory device 1, which is referred to as substantial write data. The generated redundant data and the substantial write data are written in the memory device 1. Therefore, data read from the memory device 1 includes substantial write data and the corresponding redundant data. Moreover, the ECC circuit 26 detects an error contained in data read from the memory device 1, and attempts to correct the error when the error is detected.

<1.2. Semiconductor Memory>

The memory device 1 includes components such as a memory cell array 11, an input and output circuit 12, a sequencer (control circuit) 13, a driver 15, a sense amplifier 16, and a row decoder 19.

The cell array 11 includes memory blocks BLK (BLK0, BLK1, etc.). Each block BLK is a set of string units SU (SU0, SU1, etc.). Each string unit SU is a set of NAND strings (strings) STR (STR0, STR1, etc.)(not illustrated). The string STR includes memory cell transistors MT.

The input and output circuit 12 is coupled to the memory controller 2 via a NAND bus. The NAND bus transmits control signals and a signal DQ having a width of eight bits. The control signal includes signals CLE, ALE, ⁻WE, ⁻RE. The input and output circuit 12 receives the control signals from the memory controller 2, and fetches and outputs the signal DQ based on the control signals. The signal DQ may be a command (CMD), data (DAT), an address signal (ADD), status information (STA), or the like.

The signal CLE being asserted informs the memory device 1 that the signal DQ input to the memory device 1 in parallel with the signal CLE is the command CMD. The signal ALE being asserted informs the memory device 1 that the signal DQ input to the memory device 1 in parallel with the signal ALE is the address signal ADD. The signal ⁻WE being asserted instructs the memory device 1 to capture the signal DQ input to the memory device 1 in parallel with the signal ⁻WE. The signal ⁻RE being asserted instructs the memory device 1 to output the signal DQ. A signal RY/⁻BY indicates whether the memory device 1 is in a ready state or in a busy state, and indicates the busy state by a low level. The memory device 1 accepts the command CMD from the memory controller 2 in the ready state, and does not accept the command CMD from the memory controller 2 in the busy state.

The sequencer 13 receives the command CMD and the address signal ADD from the input and output circuit 12, and controls the driver 15, the sense amplifier 16, and the row decoder 19 based on the command CMD and the address signal ADD.

The driver 15 supplies, to the row decoder 19, a potential selected from potentials. The row decoder 19 receives various potentials from the driver 15, receives the address signal ADD from the input and output circuit 12, and transfers the potential from the driver 15 to one block BLK selected based on the received address signal ADD.

The sense amplifier 16 senses states of the cell transistors MT, generates read data based on the sensed states, and transfers write data to the cell transistors MT.

<1.3. Cell Array>

Figure 2:
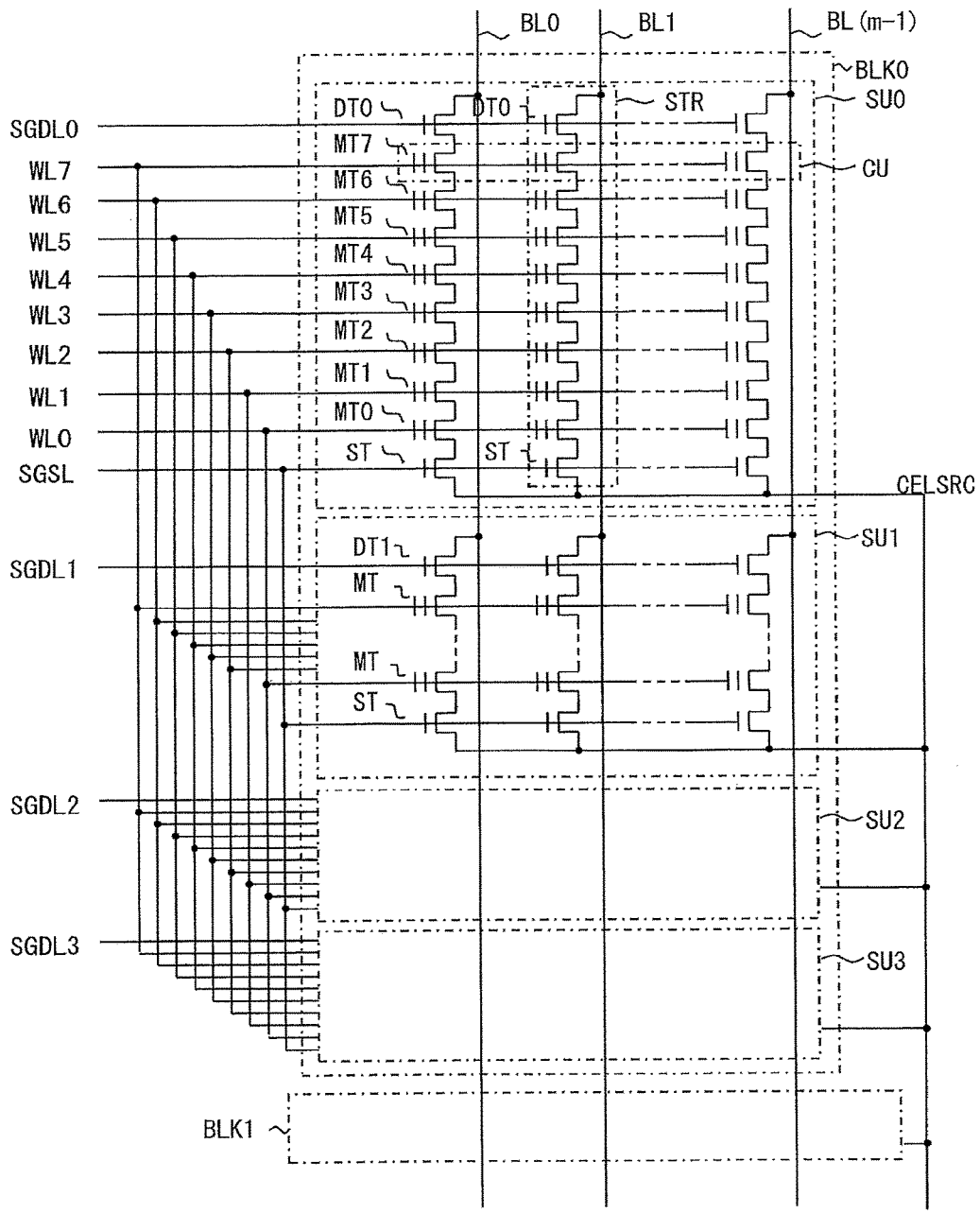
FIG. 2 exemplifies some components and connections in a cell array according to the first embodiment.

FIG. 2 exemplifies some components and connections in the cell array 11 according to the first embodiment, and illustrates components and connections in one block BLK0 and related components. A plurality of (all, for example) blocks BLK includes the components and the connections illustrated in FIG. 2.

One block BLK includes a plurality of (four, for example) string units SU0 to SU3. The following descriptions are based on an exemplary case where one block BLK includes four string units SU0 to SU3.

Each of m (m is a natural number) bit lines BL0 to BL(m−1) is coupled to one string STR from each of the string units SU0 to SU3 in each block BLK.

Each string STR includes one select gate transistor ST, a plurality of (eight, for example) cell transistors MT (MT0 to MT7), and one select gate transistor DT (DT0, DT1, DT2, or DT3). The transistors ST, MT, and DT are coupled in series in that order between a source line CELSRC and one bit line BL. Each cell transistor MT includes a control gate electrode (word line WL), and a charge storage layer insulated from the surroundings, and can store data in a nonvolatile manner based on a charge amount in the charge storage layer.

Strings STR respectively coupled to different bit lines BL constitute one string unit SU. In each string unit SU, control gate electrodes (gates) of the cell transistors MT0 to MT7 are coupled to the word lines WL0 to WL7, respectively. Further, in each block BLK, the word lines WL of the same address in different string units SU are also coupled to each other. A set of cell transistors MT sharing a word line WL in one string unit SU is referred to as a cell unit CU.

The transistors DT0 to DT3 belong to the string units SU0 to SU3, respectively. For each case where α=0 to 3 is applied, the gate of each transistor DTα of strings STR in a string unit SUα is coupled to a select gate line SGDLα. The gates of the transistors ST are coupled to a select gate line SGSL.

<1.4. Cell Transistors>

Figure 3:
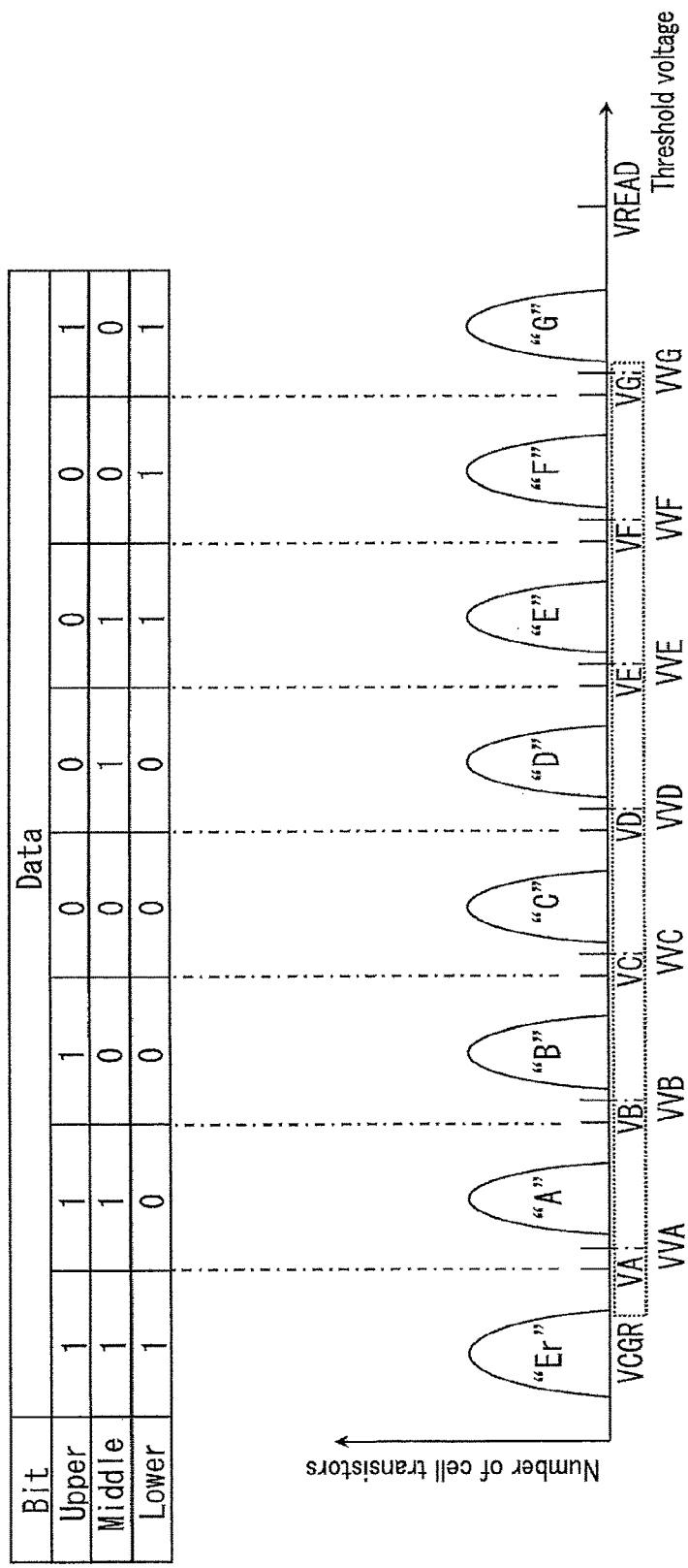
FIG. 3 illustrates distribution of threshold voltages of cell transistors storing data according to the first embodiment.

The memory device 1 may store data of two or more bits in one cell transistor MT. FIG. 3 illustrates a distribution of threshold voltages of cell transistors MT storing data of three bits per cell transistor MT as a result of writing. The threshold voltage of each cell transistor MT is, from among a plurality of ranges, within a range corresponding to stored data. In the case of storing three bits per cell transistor MT, each cell transistor MT may have any one of eight threshold voltages. The eight threshold voltages are states storing data "111", data "110", data "100", data "000", data "010", data "011", data "001", and data "101", respectively. The cell transistors MT in states storing data "111", data "110", data "100", data "000", data "010", data "011", data "001", and data "101" are referred to as in Er, A, B, C, D, E, F, and G states, respectively.

Even cell transistors MT written to store the same three-bit data may have different threshold voltages, whereby the threshold voltages are distributed.

A state of a cell transistor MT is determined in order to distinguish the data stored by the cell transistor MT to be read. Read voltages VA, VB, VC, VD, VE, VF, and VG are used for determining the state. Hereinafter, a voltage of a certain magnitude applied to the cell transistor MT to be read for determining the state, including the read voltages VA, VB, VC, VD, VE, VF, and VG, may be referred to as a read voltage VCGR.

Whether the threshold voltage of a cell transistor MT to be read exceeds a certain read voltage VCGR is used to determine the threshold voltage state of that cell transistor MT. A voltage VREAD is applied to the word line WL of the cell transistor MT that is not a target to be read, and is higher than the threshold voltages of the cell transistors MT in any state.

A set of data of bits in the same position (i.e., digit) of the cell transistor MT in one cell unit CU constitutes one page.

Verify voltages VVA, VVB, VVC, VVD, VVE, VVF, and VVG are used for verifying completion of data writing. When cell transistors MT written to the A state, B state, C state, D state, E state, F state, and G state have threshold voltages equal to or larger than the verify voltages VVA, VVB, VVC, VVD, VVE, VVF, and VVG, respectively, it is determined that the writing to the respective states of the cell transistors MT has been completed. Hereinafter, a voltage of a certain magnitude applied to the cell transistor MT to be written for verification, including the verify voltages VVA, VVB, VVC, VVD, VVE, VVF, and VVG, may be referred to as a verify voltage VV.

The threshold voltage of a cell transistor MT may vary depending on factors such as a disturbance and/or a lapse of time from immediately after being written. Depending on the manner of variation, the threshold voltage of the cell transistor MT may be erroneously determined as being in a state different from a state intended at the time of being written.

Data of four or more bits may be stored by one cell transistor MT by extending the principle described above.

The following descriptions are based on an example of storing three bits per cell transistor MT.

<2. Operation>
<2.1. Basic Operation>

Figure 4:
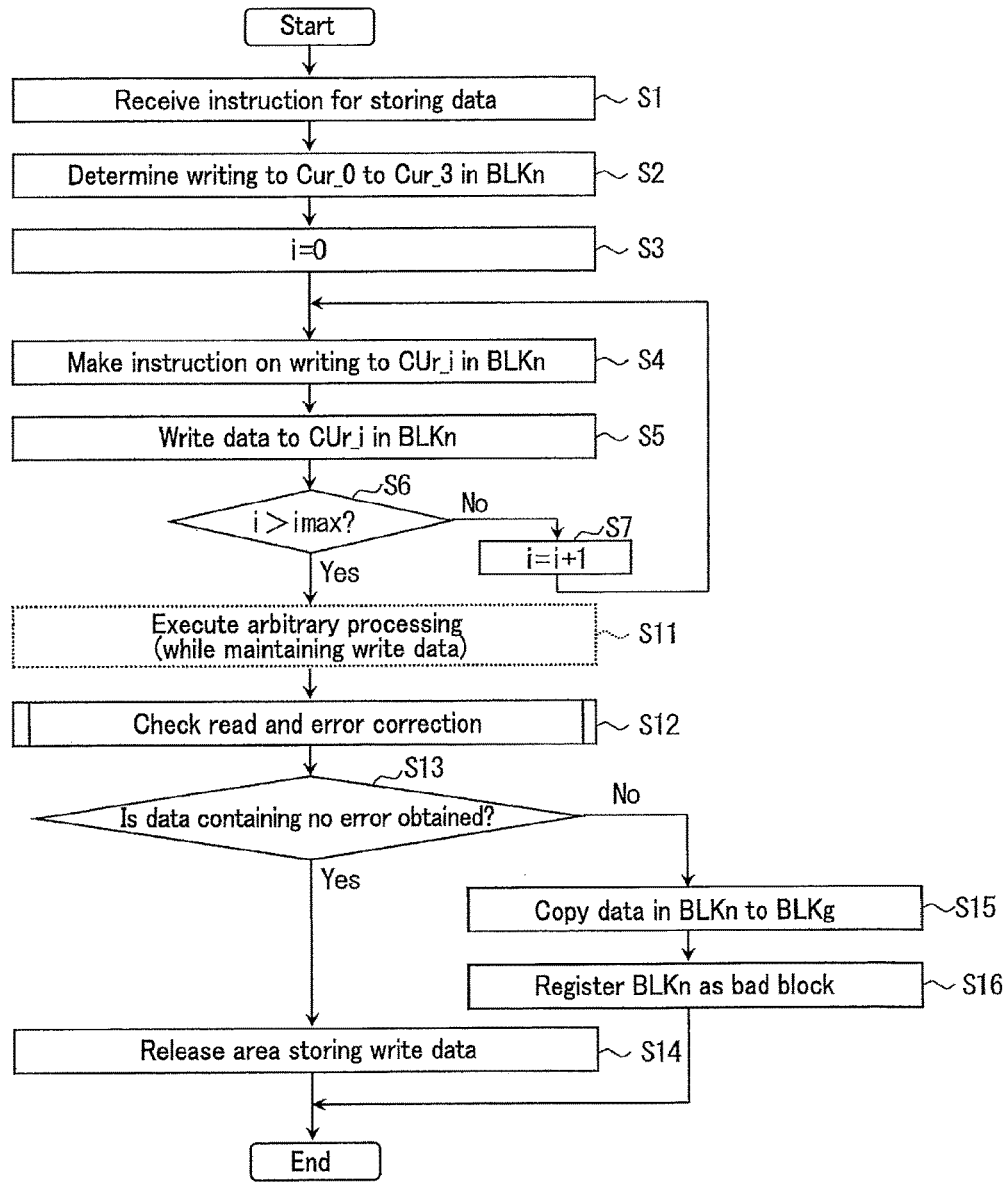
FIG. 4 is a flowchart of operation of the memory system according to the first embodiment.

FIG. 4 is a flowchart of operation of the memory system 5 according to the first embodiment. Some steps will be described in detail later.

As illustrated in FIG. 4, the memory system 5 receives an instruction for storing data from the host device 3 (step S1). The memory controller 2 determines, based on the instruction in step S1, to write data to cell units CUr_0, CUr_1, CUr_2, and CUr_3 coupled to a word line WLr (r is zero or a natural number) in a certain block BLKn (n is zero or a natural number)(step S2). A cell unit CUr_s (s is zero or a natural number) indicates a cell unit CU in a string unit SUs, which is coupled to the word line WLr.

The memory controller 2 executes, based on the determination in step S2, data writing to the cell units CUr_0, CUr_1, CUr_2, and CUr_3 in the block BLKn in step S3 and subsequent steps. Although data may be written in the cell units CUr_0, CUr_1, CUr_2, and CUr_3 in arbitrary order, an example of data writing in the order of the cell units CUr_0, CUr_1, CUr_2, and CUr_3 is described. Besides, in order to describe such writing in a simple manner, a variable i is introduced. The variable i is introduced for convenience of descriptions, and the actual use of the variable i is not essential as long as the operation using the variable i to be described below is performed. The variable i may be, based on the current example, either one of zero or a natural number equal to or less than three.

In step S3, the memory controller 2 sets the variable i to zero.

In step S4, the memory controller 2 provides an instruction on data writing to the cell unit CUr_i in the block BLKn. An instruction for writing data to a certain cell unit CU includes supplying a command set and write data to the memory device 1. The command set for the instruction on the data writing to the cell unit CUr_i makes an instruction on writing data of three pages to the cell unit CUr_i, and the write data has a size of three pages. The details of the command set are arbitrary, and the order in which commands and the write data in the command set are transmitted from the memory controller 2 is also arbitrary.

Upon receipt of the instruction in step S4, the memory device 1 writes the data in the cell unit CUr_i in the block BLKn (step S5). Writing to a certain cell unit CU includes a repetition of multiple program loops. Each program loop includes a program stage, a verifying stage, and a determining stage. The program stage includes, using the sequencer 13, applying voltages (program voltages) to cell transistors (selected cell transistors) MT for which the program has not been completed in the cell unit CU to be written, and raising the threshold voltage of the selected cell transistors MT. Only a voltage sufficiently lower than the program voltages is applied to the selected cell transistors MT for which the program has been completed. The verifying stage includes verification, which includes determining whether each of the selected cell transistors MT has a threshold voltage of equal to or more than a verify voltage VVX corresponding to an X state (X is A, B, C, D, E, F, or G) that is a target state of the selected cell transistor MT after the program is completed. The determining stage includes confirming whether writing to the cell unit CU to be written has been completed. More specifically, when the number of the selected cell transistors MT of which the X state is the target state satisfies a certain condition (the number is equal to or more than a certain number, or the number of the cell transistors MT with the target X state is equal to or more than a certain ratio with respect to the cell transistors MT), it is determined that the program in the X state has been completed. When the sequencer 13 determines that all the programs in the A, B, C, D, E, F, and G states in the cell unit CUr_i have been completed, the sequencer 13 determines that the data writing to the cell unit CUr_i has been completed.

The sequencer 13 continues to transmit a busy signal until it determines that the data writing to the cell unit CUr_i has been completed, and releases the busy state upon completion of the data wring to the cell unit CUr_i. The memory controller 2 monitors the busy signal, and determines that the latest instruction, that is, the data writing to the cell unit CUr_i in the current example, has been completed when the release of the busy state is detected.

The memory controller 2 similarly performs data writing to the cell units CUr_1, CUr_2, and CUr_3. To this end, in step S6, the memory controller 2 determines whether the variable i exceeds a maximum value imax, that is, i exceeds three in the current example. When i is equal to or less than imax (=3)(No branch), the memory controller 2 increments the variable i by one in step S7, and the process returns to step S4. When i exceeds imax (=3)(Yes branch in step S6), this indicates that the data writing to the cell units CUr_0, CUr_1, CUr_2, and CUr_3 has been completed, and the process proceeds to step S11.

The memory controller 2 continues to store data to be written in the cell units CUr_0, CUr_1, CUr_2, and CUr_3 in the RAM 23 during the period from step S1 to step S14 to be described later.

In step S11, the memory controller 2 may execute arbitrary processing as long as the write data for the cell units CUr_0, CUr_1, CUr_2, and CUr_3 is maintained. Examples of the processing include reading data from an arbitrary cell unit CU, and reading status information. Step S11 continues to step S12. Step S11 may not be performed, and the Yes branch of step S6 may directly continue to step S12.

The processing in steps S12, S13, S14, S15, and S16 is autonomously executed by the memory controller 2 without being based on the instruction from the host device 3.

In step S12, the memory controller 2 reads data from an arbitrary page of CUr_s, which is an arbitrary one of the cell units CUr_0, CUr_1, CUr_2, and CUr_3, detects an error in the read data, and attempts to correct the error when the error has been detected. Only one set of a data read and an error correction of corresponding read data may be performed, or a plurality of sets of the data read and the data correction, which is different in a method, may be performed. In a case where the plurality of sets of the data read and the error correction attempt is performed, for example, when a first set of the data read and the error correction fails, a second set of the data read and the error correction is attempted. A set of the data read and the error correction and the number of the sets thereof may be arbitrarily selected, and in practice, the data read and the error correction attempt of the type and the number that can be completed during a period determined by a requirement imposed on the memory system 5 may be performed. A specific example of step S12 will be described later. An example of the selection of data to be read will also be described later. The read in step S12 may be hereinafter referred to as a check read.

When no error is detected, or when the detected error has been successfully corrected, data written in a check read target page can be obtained. Such data is hereinafter referred to as read data (or, data) containing no error including a case where no error has been detected.

In the case where the plurality of sets of the data read and the error correction attempt is performed, for example, when the error corrections fail in all the sets subject to the error correction execution, it is determined that the error correction has failed.

In step S13, the memory controller 2 determines whether the read data containing no error has been obtained. As described above, in step S12, two or more check reads may be performed. Therefore, the processing in step S13 corresponds to the determination as to whether the read data containing no error has been obtained from the check read performed last in step S12.

When the read data containing no error has been obtained (Yes branch), the process proceeds to step S14. When the read data containing no error has not been obtained (No branch), the process proceeds to step S15.

In step S14, the memory controller 2 releases an area in which data to be written in CUr_0, CUr_1, CUr_2, and CUr_3 in the RAM 23 are stored.

In step S15, the memory controller 2 copies the data written in the block BLKn to another block BLKg (g is zero or a natural number other than n). At this time, the memory controller 2 writes the data in the RAM 23 to the block BLKg without using the data written in the cell units CUr_0 to CUr_3 in the block BLKn. Details of step S15 will be described later.

In step S16, the memory controller 2 updates its own internal management information such that the block BLKn is treated as a bad block. The memory controller 2 may not use the block BLKn registered as a bad block as a data writing destination in the future, or the block BLKn registered as a bad block may be used when the number of free blocks BLK decreases while not being used as a data writing destination in principle.

Figure 5:
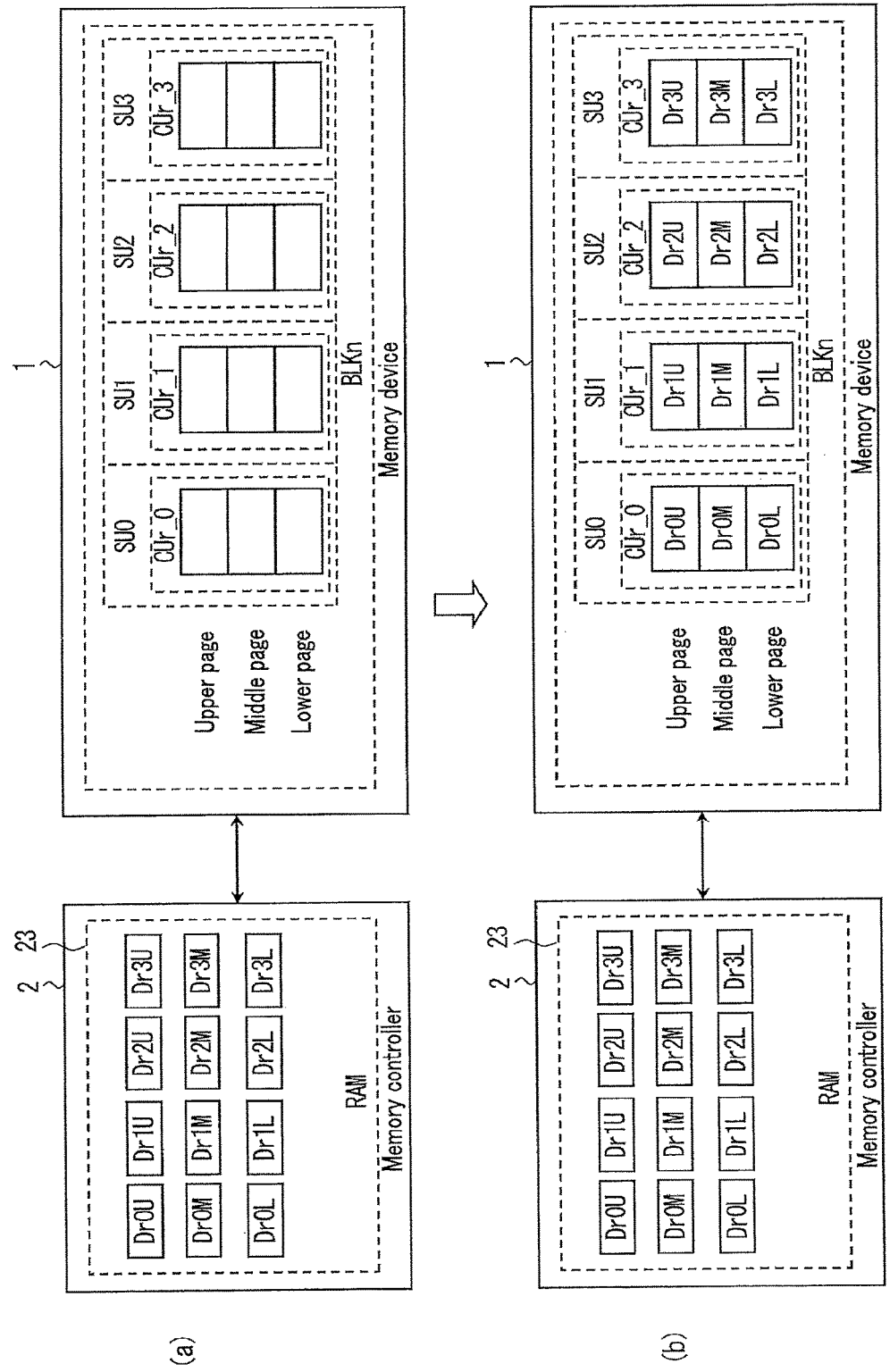
FIG. 5 illustrates some states of a part of the memory system according to the first embodiment.

FIG. 5 illustrate the states of a part of the steps S1 to S5 and the Yes branch of S6 of the memory system 5 according to the first embodiment. As illustrated in sections (a) and (b) of FIG. 5, data is written in all pages of the cell units CUr_0, CUr_1, CUr_2, and CUr_3 in an erased state. FIG. 5 illustrates an exemplary case where write data Dr0L, Dr0M, and Dr0U are written in a lower page, a middle page, and an upper page of the cell unit CUr_0, respectively. Similarly, write data Dr1L, Dr1M, and Dr1U are written in a lower page, a middle page, and an upper page of the cell unit CUr_1, respectively. Write data Dr2L, Dr2M, and Dr2U are written in a lower page, a middle page, and an upper page of the cell unit CUr_2, respectively. Write data Dr3L, Dr3M, and Dr3U are written in a lower page, a middle page, and an upper page of the cell unit CUr_3, respectively.

During the writing in FIG. 5, the memory controller 2 continues to store the write data Dr0L, Dr0M, Dr0U, Dr1L, Dr1M, Dr1U, Dr2L, Dr2M, Dr2U, Dr3L, Dr3M, and Dr3U.

Figure 6:
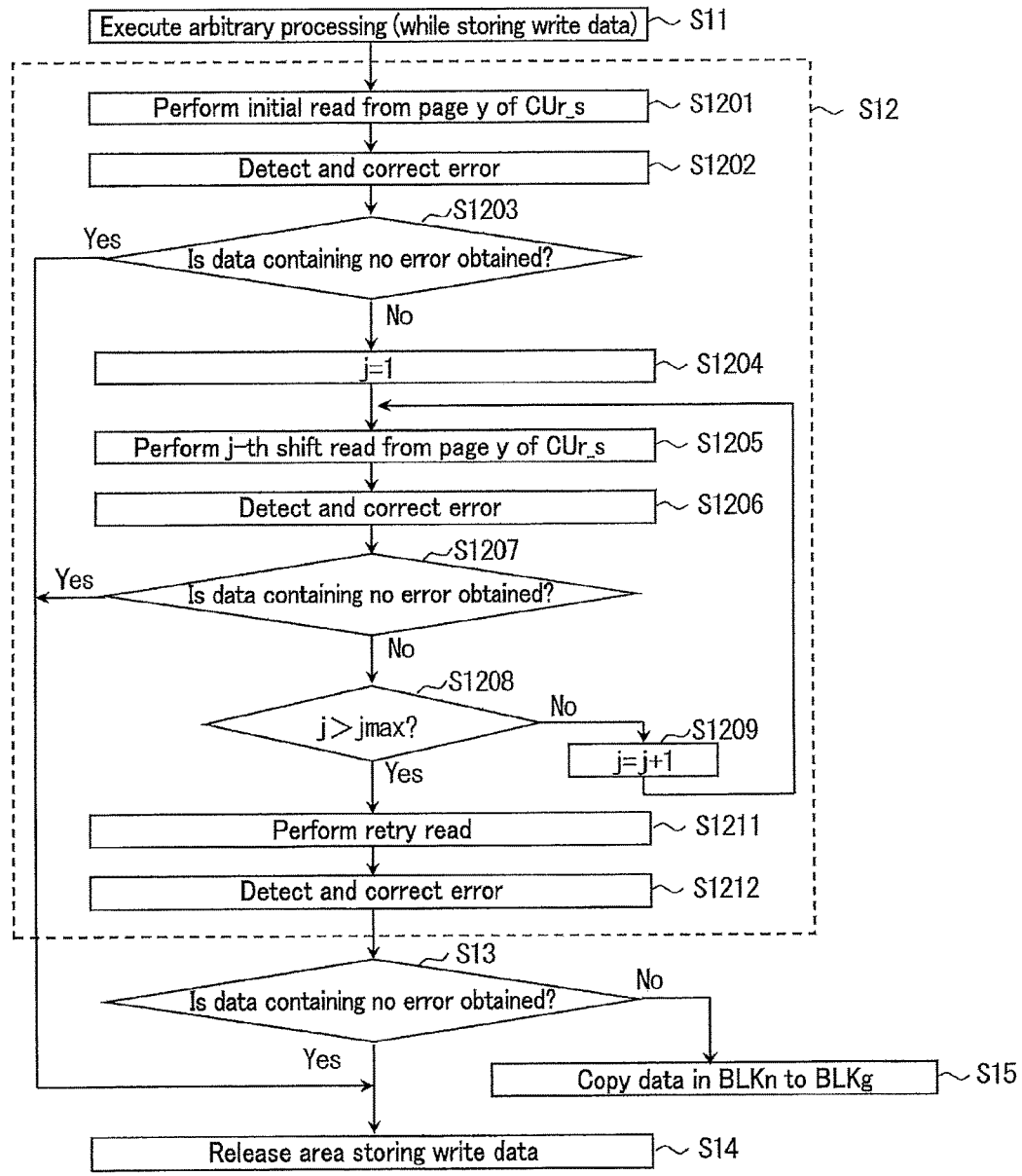
FIG. 6 illustrates a sub-flow of a part of the memory system operation according to the first embodiment.

FIG. 6 illustrates an example of a sub-flow of step S12 of the memory system according to the first embodiment. Step S11 continues to step S1201. In step S1201, the memory controller 2 instructs the memory device 1 to read data from page y (y is a lower, a middle, or an upper) of the cell unit CUr_s. The first read in step S12, that is, the read in step S1201, is referred to as an initial read. In the initial read, for example, the use of the default read voltage VCGR is specified. Alternatively, a read voltage formerly determined based on the result of reading data from the cell unit CUr_s may be used. A read data Drsy0 obtained by the initial read is received by the memory controller 2.

In step S1202, the memory controller 2 attempts to correct an error in the read data Drsy0. In step S1203, the memory controller 2 determines whether the read data Drsy0 containing no error has been obtained, that is, either the phenomenon in which the read data Drsy0 contains no error or the phenomenon in which the error in the read data Drsy0 has been successfully corrected has occurred. When the read data Drsy0 containing no error has been obtained (Yes branch), the process proceeds to step S14. When the error-corrected read data Drsy0 has not been obtained (No branch), the process proceeds to step S1204.

The memory controller 2 performs one or more shift reads and attempts to correct an error in the data read in each shift read by the processing of S1204, S1205, S1206, S1208, and S1209. The shift read indicates a read with specification of the use of a read voltage VCGR having a magnitude different from that of the default read voltage VCGR. A set of the shift read and the attempt of the error correction in the corresponding read data may be performed arbitrary times. In practice, the number of times that can be completed during a period determined by a requirement imposed on the memory system 5 may be performed. FIG. 6 exemplifies a flow in which a loop including the set of the shift read and the attempt of the error correction in the corresponding read data is performed more than once. A variable j (j is a natural number) is introduced to execute the processing of two or more loops. The variable j is introduced for convenience of descriptions, and the actual use of the variable j is not essential as long as the operation using the variable j to be described below is performed.

In step S1204, the memory controller 2 sets the variable j to one.

In step S1205, the memory controller 2 instructs the memory device 1 to perform the j-th shift read from the page y of the cell unit CUr_s. In the shift read in step S1205, a read voltage VCGR having a magnitude different from that of the read voltage VCGR specified in the initial read and that of the read voltage. VCGR specified in step S1204 in any loop before the current loop is specified. A read data Drsyj obtained by the j-th shift read is received by the memory controller 2.

In step S1206, the memory controller 2 attempts to correct an error in the read data Drsyj. In step S1207, the memory controller 2 determines whether the read data Drsyj containing no error has been obtained. When the read data Drsyj containing no error has been obtained (Yes branch), the process proceeds to step S14. When the error-corrected read data Drsyj has not been obtained (No branch), the process proceeds to step S1208.

In step S1208, the memory controller 2 determines whether the variable j exceeds a predetermined maximum value jmax. When the variable j is equal to or less than the maximum value jmax (No branch), the memory controller 2 increments the variable j by one in step S1209, and the process returns to step S1205. When the variable j exceeds the maximum value jmax (Yes branch in step S1208), the flow moves to step S1211.

In step S1211, the memory controller 2 performs a retry read on the memory device 1. Examples of the retry read include various types thereof such as estimation of the read voltage VCGR using a Vth tracking, and a data read with the use of the estimated read voltage VCGR specified. The Vth tracking includes estimating the number of cell transistors MT having each of a plurality of threshold voltages from data read results using a plurality of read voltages VCGR having different magnitudes, and estimating from the estimated number a read voltage VCGR that can lead to fewer errors. A read data Drsyk (k=jmax+1) obtained by the retry read is received by the memory controller 2.

In step S1212, the memory controller 2 attempts to correct an error in the read data Drsyk. Step S1212 continues to step S13. In the current example, in step S13, the memory controller 2 attempts to correct the error in the read data Drsyk.

The sub-flow in FIG. 6 may further include steps of an additional data read and an error correction, which can be performed when the error correction with respect to the read data Drsyk fails in step S1212. The jmax-th shift read in step S1205 may continue to step S13.

Figure 7:
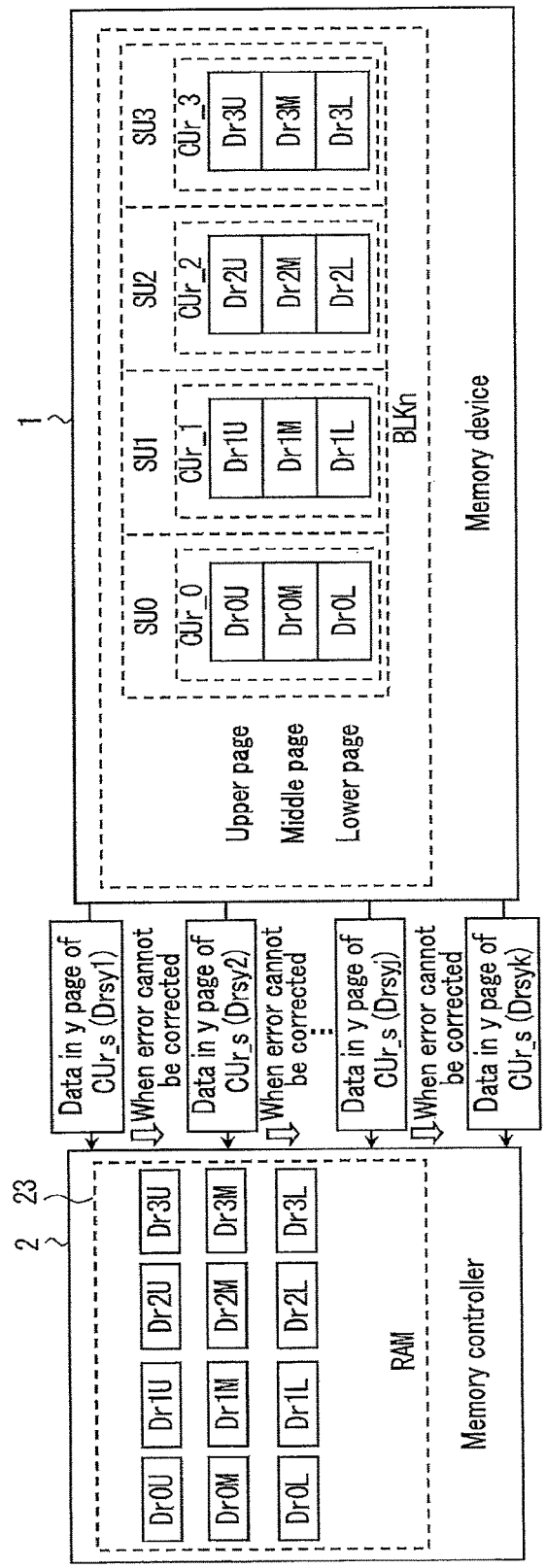
FIG. 7 illustrates a state of a part of the memory system during certain processing according to the first embodiment.

FIG. 7 illustrates a state of a part of the memory system 5 during step S12 according to the first embodiment. As illustrated in FIG. 7, the memory controller 2 reads data from the page y of the cell unit CUr_s under various read conditions, and obtains read data Drsy1, Drsy2, ... Drsyj, and Drsyk. Meanwhile, the memory controller 2 continues to store the data Dr0L, Dr0M, Dr0U, Dr1L, Dr1M, Dr1U, Dr2L, Dr2M, Dr2U, Dr3L, Dr3M, and Dr3U.

As an object of the check read, from among the four cell units CUr_0, CUr_1, CUr_2, and CUr_3 coupled to the word line WLr, a cell unit CUr including a cell transistor MT whose threshold voltage is likely to fluctuate more after being written may be selected. In the case where data is written in the order of the cell units CUr_0, CUr_1, CUr_2, and CUr_3 as described above, the cell unit CUr_0 may be selected.

Further, the object of the check read may be a page that is likely to contain more errors, which is determined based on, for example, correspondence between the state of the written cell transistors MT and bits as illustrated in FIG. 3. For example, according to the example in FIG. 3, the lower page in which the distinction between the A state whose the threshold voltage is likely to fluctuate after being written and the Er state is used for determining data may be selected.

Figure 8:
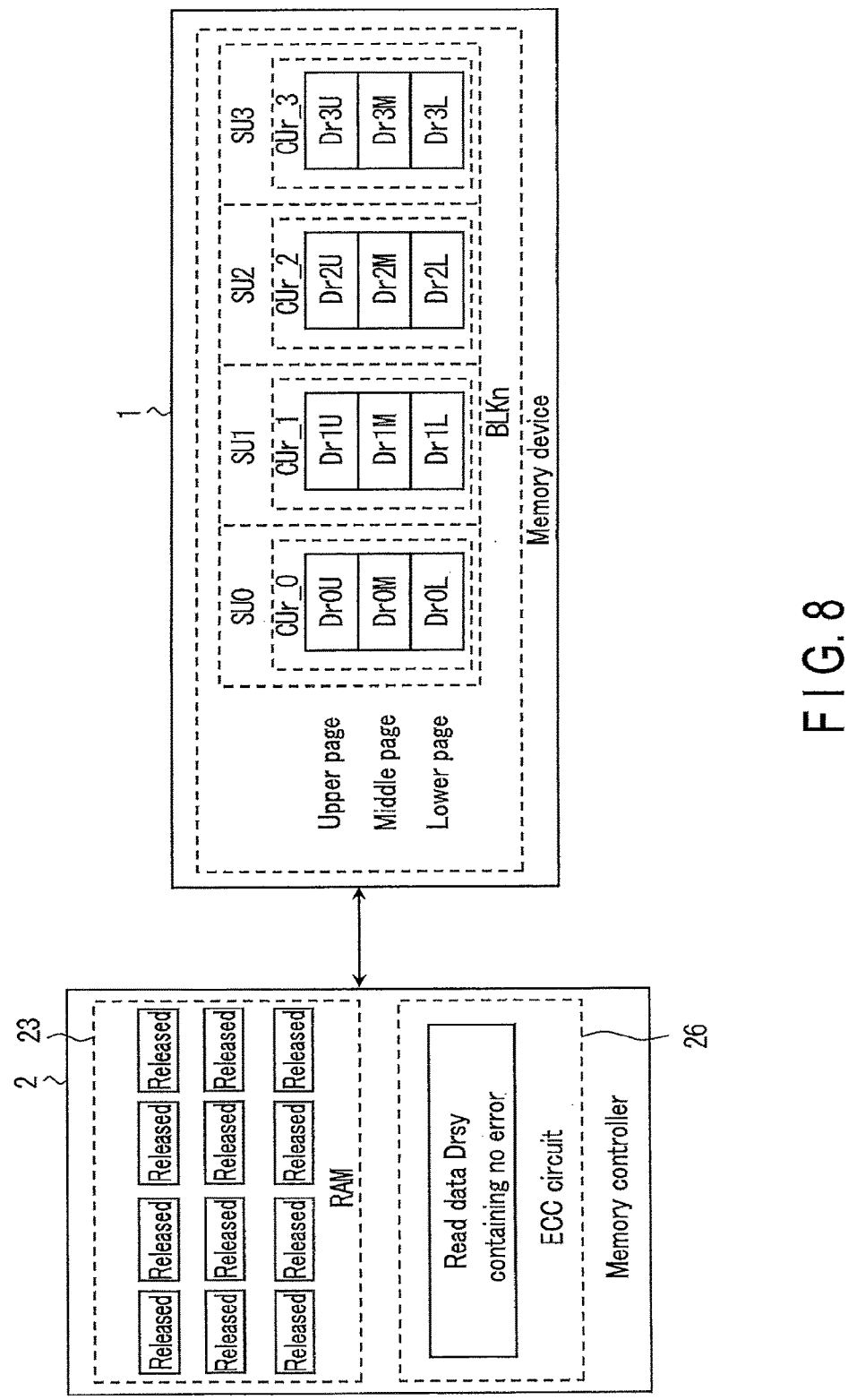
FIG. 8 illustrates another state of a part of the memory system during certain processing according to the first embodiment.

FIG. 8 illustrates a state of a part of the memory system during step S14 according to the first embodiment. As illustrated in FIG. 8, since the read data Drsy containing no error has been obtained, the memory controller 2 releases the area in the RAM 23 in which data Dr0L, Dr0M, Dr0U, Dr1L, Dr1M, Dr1U, Dr2L, Dr2M, Dr2U, Dr3L, Dr3M, and Dr3U are stored in step S14.

Figure 9:
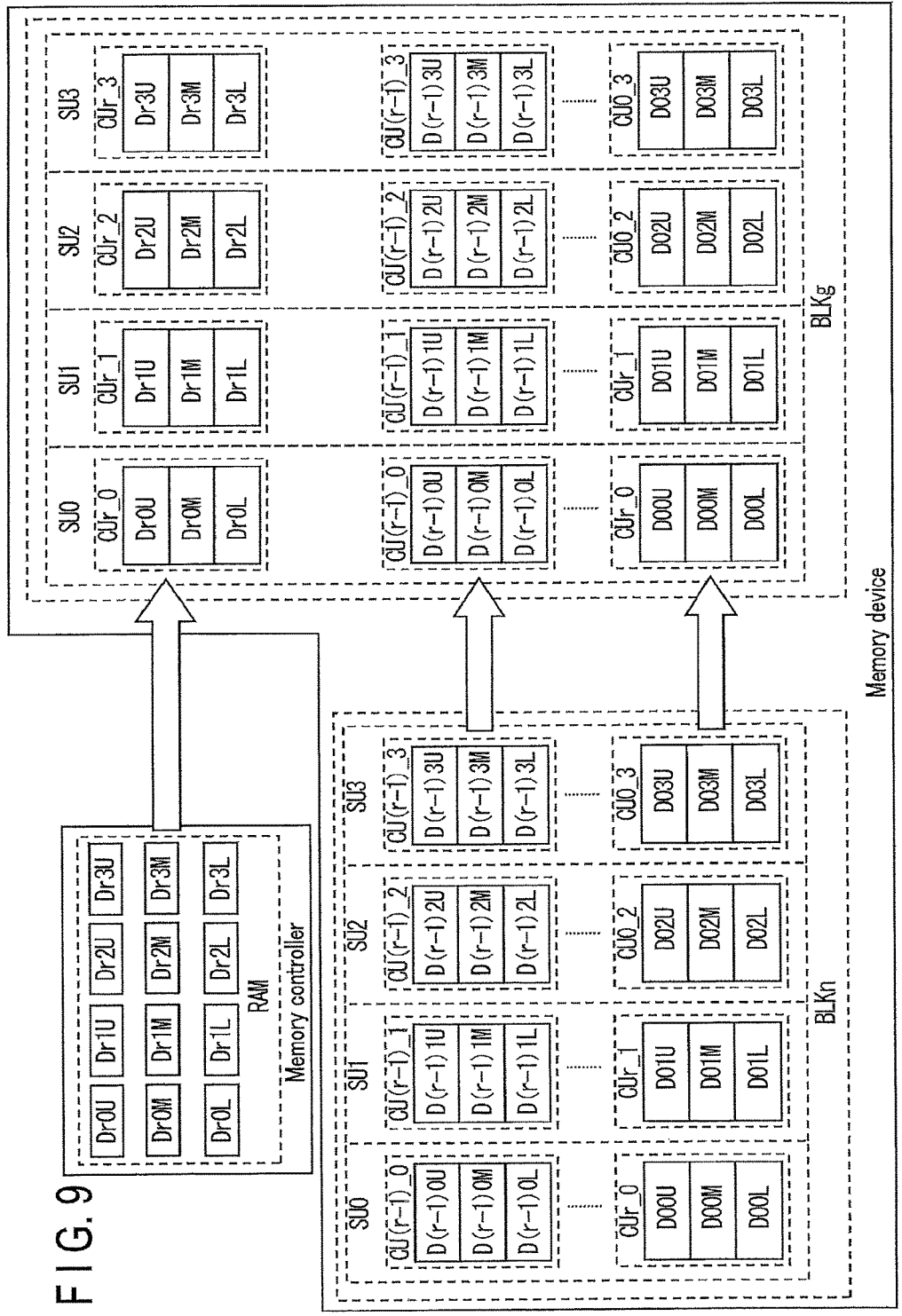
FIG. 9 illustrates another state of a part of the memory system during certain processing according to the first embodiment.

FIG. 9 illustrates a state of the memory system 5 during step S15 according to the first embodiment. FIG. 9 relates to an example in which, with respect to each case where β (β is zero or a natural number equal to or less than three) is between zero and three at the start of writing to the cell unit CUr in the block BLKn, data is written in cell units CU0_β to CU(r−1)_β in the block BLKn. As illustrated in FIG. 9, the memory controller 2 instructs the memory device 1 to copy the data written in the block BLKn at the start of the flow in FIG. 4 to another block BLKg. The instruction includes one or more copy commands, and each copy command may include identification of a copy source cell unit CU and a page, and identification of a copy destination cell unit CU and a page. There is no restriction imposed on the copy destination of data. Description is given of an exemplary case where, with respect to each case where γ (γ is different from r, and is zero or a natural number) is between zero and r−1, data in a lower page, data in a middle page, and data in an upper page of the cell unit CUγ of the string unit SUs in the block BLKn are copied to a lower page, a middle page, and an upper page of the cell unit CUγ of the string unit SUs in the block BLKg, respectively.

Further, the memory controller 2 writes the data Dr0L, Dr0M, Dr0U, Dr1L, Dr1M, Dr1U, Dr2L, Dr2M, Dr2U, Dr3L, Dr3M, and Dr3U in the RAM 23 to the block BLKg. For example, the memory controller 2 performs the following writing. The memory controller 2 writes the data Dr0L, Dr0M, and Dr0U to the lower page, the middle page, and the upper page of the cell unit CUr of the string unit SU0 in the block BLKg, respectively. The memory controller 2 writes the data Dr1L, Dr1M, and Dr1U to the lower page, the middle page, and the upper page of the cell unit CUr of the string unit SU1 in the block BLKg, respectively. The memory controller 2 writes the data Dr2L, Dr2M, and Dr2U to the lower page, the middle page, and the upper page of the cell unit CUr of the string unit SU2 in the block BLKg, respectively. The memory controller 2 writes the data Dr3L, Dr3M, and Dr3U to the lower page, the middle page, and the upper page of the cell unit CUr of the string unit SU3 in the block BLKg, respectively.

When the writing of the data Dr0L, Dr0M, Dr0U, Dr1L, Dr1M, Dr1U, Dr2L, Dr2M, Dr2U, Dr3L, Dr3M, and Dr3U to the block BLKg has been completed, the memory controller 2 releases the area in the RAM 23 in which the data Dr0L, Dr0M, Dr0U, Dr1L, Dr1M, Dr1U, Dr2L, Dr2M, Dr2U, Dr3L, Dr3M, and Dr3U are stored. Further, the memory controller 2 updates the information regarding the block BLKn such that the information indicating the block BLKn is a bad block is included therein.

<2.2. Extended Operation>

The object of the check read in the operation described above is only one page of only one cell unit CUr from among the cell units CUr_0, CUr_1, CUr_2, and CUr_3 sharing the word line WLr. Embodiments are not limited to this example, and the check read may be performed on two or more cell units CU and/or two or more pages.

Figure 10:
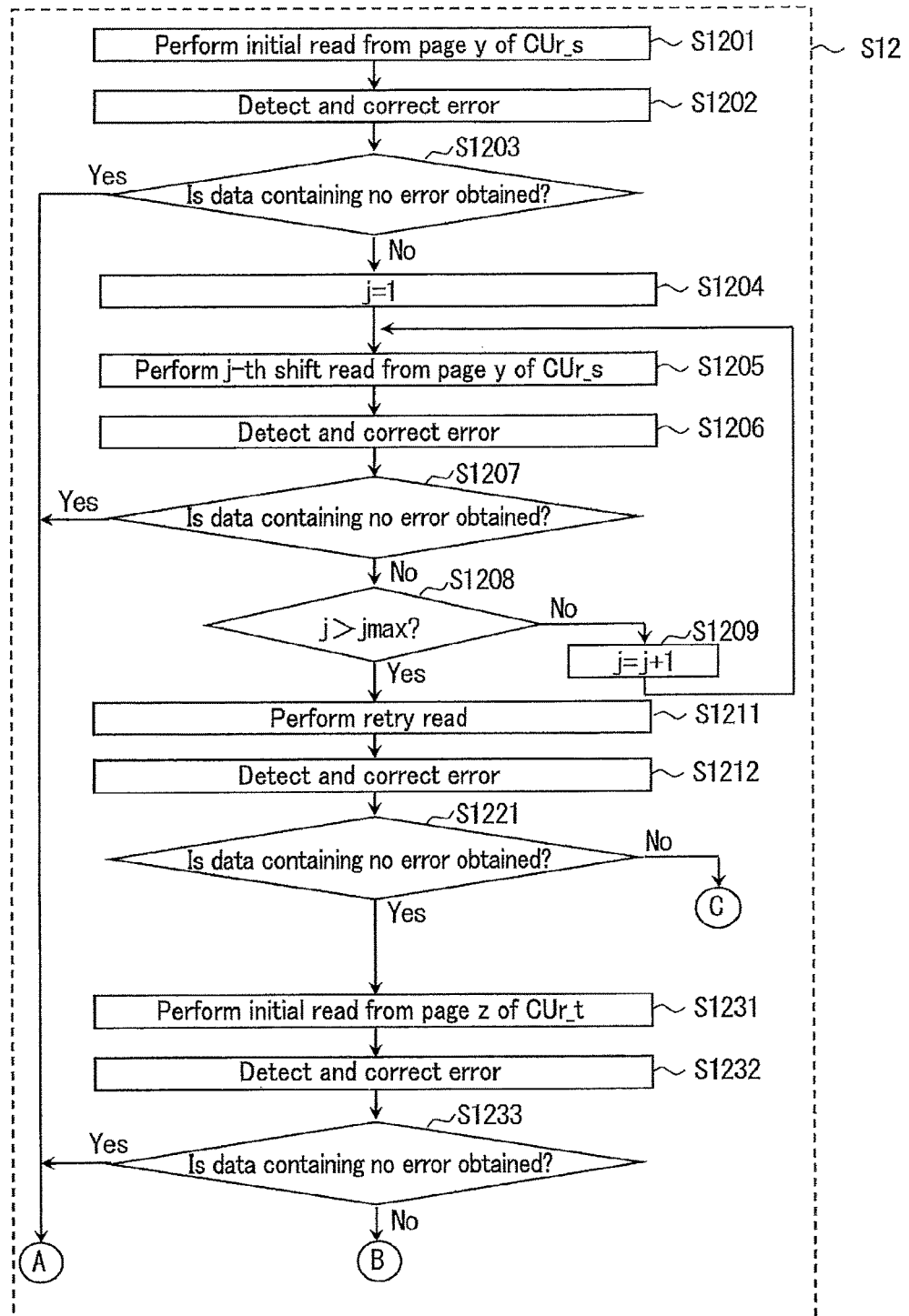
FIG. 10 illustrates a sub-flow of the operation of the memory system according to the first embodiment.
Figure 11:
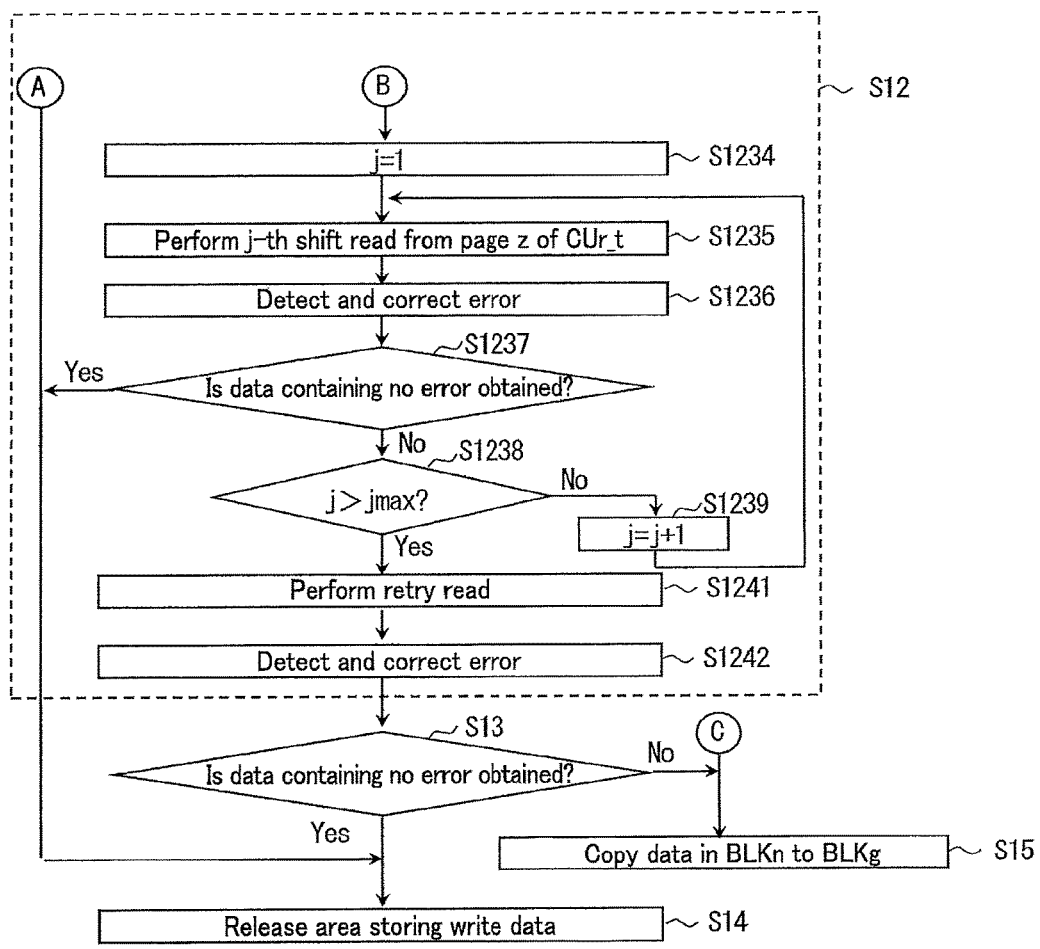
FIG. 11 illustrates another sub-flow of the operation of the memory system according to the first embodiment.

FIGS. 10 and 11 illustrate a flow of another operation of the memory system 5 according to the first embodiment, illustrate a flow of an extended operation, and illustrate a sub-flow in step S12.

As illustrated in FIGS. 10 and 11, in step S12, steps S1201 to S1209, step S1211, and step S1212 are performed in the same manner as in FIG. 6. On the other hand, unlike the case in FIG. 6, step S1212 continues to step S1221.

In step S1221, the memory controller 2 determines whether the read data containing no error has been successfully obtained in step S1212. When the data containing no error has not been obtained (No branch), the flow moves to step S15. When the data containing no error has been obtained (Yes branch), the flow moves to step S1231.

The steps from step S1231 are the same as the steps S1201 to S1211 except that the object of the check read is different. That is, in step S1231, the memory controller 2 instructs the memory device 1 to read data in page z of a cell unit CUr_t in the block BLKn. Here, t is 0, 1, 2, or 3, and z is lower, middle, or upper. However, only a combination in which t=s and z=y are applied is excluded. In other words, in step S1231, the memory controller 2 reads data in a page different from the target page of the check read in step S1201.

Steps S1232, S1233, S1234, S1235, S1236, S1237, S1238, S1239, S1241, and S1242 are similar to or the same as steps 1202, S1203, S1204, S1205, S1206, S1207, S1208, S1209, S1211, and S1212, respectively.

Step S1242 continues to step S13.

According to step S12 as described above, the check read is performed on two different pages in the cell units CUr_0 to CUr_3. Then, when data containing no error has been obtained by the check read performed on both pages, the processing in step S14 (release of the area storing write data) is executed. On the other hand, when the data containing no error is not obtained by the check read performed on either one of the pages, the processing in step S15 (bad block registration of the block BLKn) is executed.

The check read may be performed on three or more pages by extending the operation described with reference to FIGS. 10 and 11 based on the descriptions made with reference to FIGS. 10 and 11. Such operation may be implemented by those skilled in the art by referring to the descriptions made with reference to FIGS. 10 and 11 even if the detailed descriptions are not available.

<3. Advantages>

According to the first embodiment, data containing fewer errors can be output from the memory device 1, as described below.

As described above, the program for a certain selected cell transistor MT is determined to have been completed when the selected cell transistor MT has a threshold voltage equal to or more than the verify voltage VVX corresponding to the target X state. Although the program voltage is not applied to cell transistors MT for which the program has been completed before completion of the writing to the cell unit CUr to be written, a voltage lower than the program voltage is applied thereto. Therefore, the selected cell transistor MT for which the program has been completed may be subject to a program disturbance. The program disturbance may unintentionally increase the threshold voltage of the selected cell transistor MT being subject to the program disturbance. When the increased amount of the threshold voltage is large, the selected cell transistor MT with the increased threshold voltage may enter a state having a threshold voltage that may be determined to be a state different from (one upper) the target X state. Such a selected cell transistor MT is determined to have succeeded in the program, but may output data different from the data corresponding to the X state expected at the time of being read after the writing. This may lead to an error in reading from the cell unit CUr.

In particular, when the data is written in a certain order to the cell units CUr_0, CUr_1, CUr_2, and CUr_3 respectively included in the four string units SU0 to SU3 coupled to the word line WLr, a cell unit CUr in which the writing has been completed at an earlier stage (CUr_0, for example) receives greater disturbance. Therefore, the data in the cell unit CUr to be written earlier may be unintentionally changed.

According to the first embodiment, write data is sequentially written to one or more cell units CUr_s sharing a word line WL, data is read from one or more pages of one or more cell units CUr_s while the write data is stored by the memory controller 2, and it is determined whether the read data contains errors more than a certain reference. When errors less than the reference are contained, the cell unit CUr_s can be determined that the write data is highly likely to be stored therein with accuracy that is high to some extent (accuracy at least enough to obtain data containing no error) even after receiving the write disturbance. On the other hand, when errors equal to or more than the reference are contained, the cell unit CUr_s can be determined that the write data is highly likely to be stored therein with low accuracy although a program verify has been passed. For example, the memory system 5 as a whole can store data with higher accuracy by limiting the use of the cell unit CUr_s that may store data with such low accuracy. Moreover, since the cell unit CU that may store data with low accuracy is identified while the write data can be obtained, a rewrite of the write data (writing to the cell unit CU different from the cell unit CUr_s) can be easily performed.

Second Embodiment

A second embodiment relates to a case where an instructed writing is suspended.

A memory system 5 according to the second embodiment includes the components and connections same as the memory system 5 according to the first embodiment. In contrast, a memory controller 2 according to the second embodiment is configured to perform operation to be described below, specifically, in particular to cause a firmware in the ROM 24 to cause the memory controller 2 to perform the operation to be described below.

Figure 12:
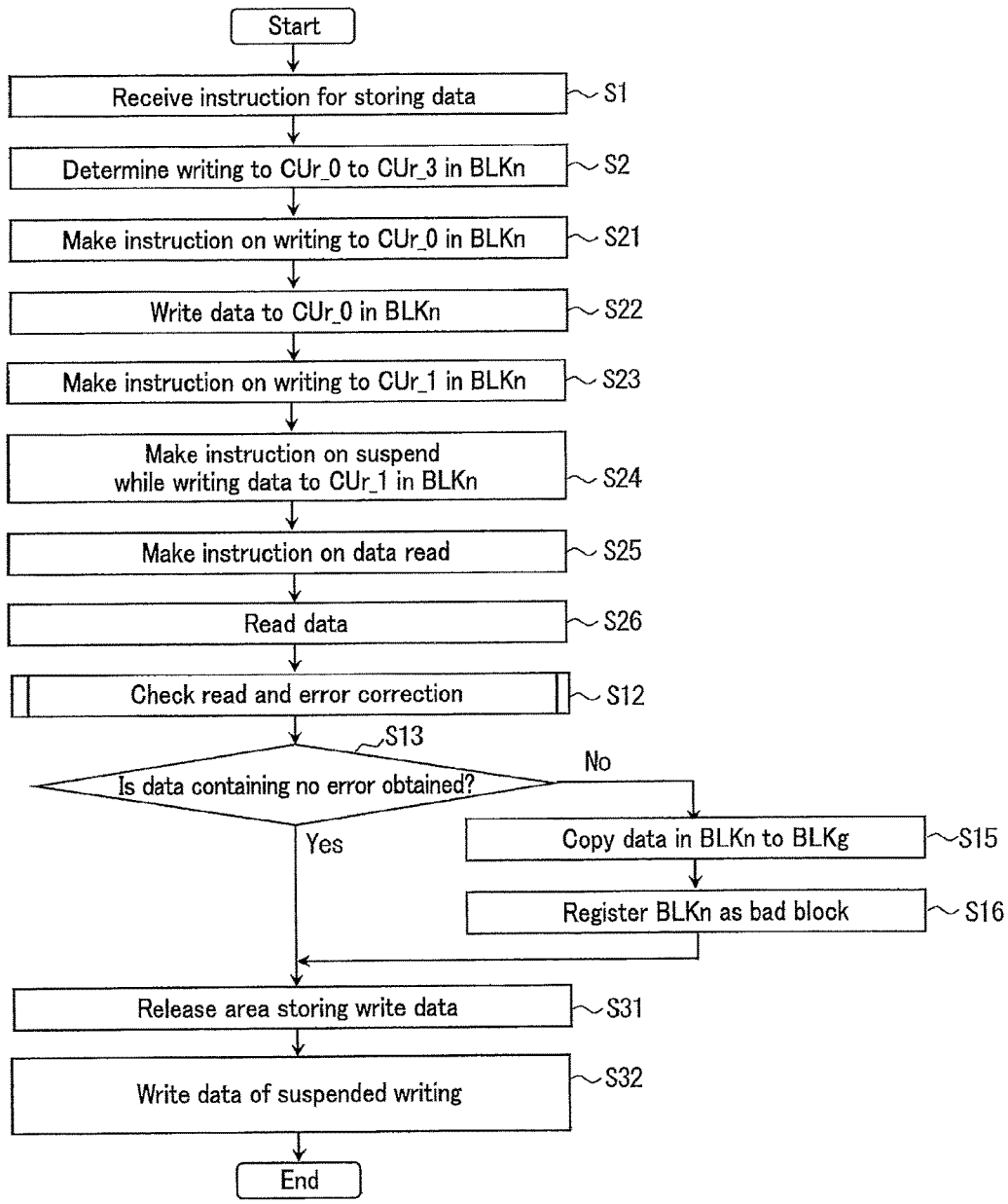
FIG. 12 is a flowchart of operation of a memory system according to a second embodiment.

FIG. 12 illustrates a flow of the operation of the memory system 5 according to the second embodiment, and illustrates a flow in a case where a suspend command has been received during a certain writing in a memory device 1. As an example of a reception timing of the suspend command, FIG. 12 and the following descriptions relate to reception during data writing to a cell unit CUr_1.

As illustrated in FIG. 12, processing in steps S1 and S2 is executed in that order. Subsequently, in step S21, the memory controller 2 makes an instruction on data writing to a cell unit CUr_0 in a block BLKn. In step S22, the memory device 1 writes data to the cell unit CUr_0. In step S23, the memory controller 2 makes an instruction on data writing to the cell unit CUr_1 in the block BLKn.

In step S24, the memory controller 2 transmits a suspend command to the memory device 1 while the memory device 1 is writing data to the cell unit CUr_1. Upon receipt of the command, the memory device 1 suspends the instruction currently being executed, that is, the data writing to the cell units CUr_1.

In step S25, the memory controller 2 instructs the memory device 1 to read some data. No special conditions are imposed on the data to be read. In step S26, the memory controller 2 performs the instructed data read. Step S26 continues to step S12.

Step S12 is the same as that in the first embodiment. However, unlike the case in the first embodiment, in the second embodiment, the writing to the cell units CUr_0 to CUr_3 is not completed at the start of step S12. Accordingly, an object of a check read is a written page from among CUr_0 to CUr_3, which is, in the current example, one or more pages from among a lower page, a middle page, and an upper page of the cell unit CUr_0. Step S12 continues to step S13.

A branch (Yes branch) in a case where data containing no error has been obtained in step S13 continues to step S31. A branch (No branch) in a case where the data containing no error is not obtained in step S13 continues to step S31 via steps S15 and S16.

Step S31 is similar to step S14. The difference is that, in step S31, the area in the RAM 23 in which the data written before the suspend instruction in step S24 has been stored is released.

In step S32, incomplete writing from among the data writing determined in step S2 (including the writing being performed at the time of the suspend instruction in step S24) is performed. The data writing in step S32 may be performed on a cell unit CU in the block BLKn when data of a check read target containing no error has been obtained. On the other hand, the data writing in step S32 may be performed on a cell unit CU in a block BLKg when the data of the check read target containing no error has not been obtained.

Figure 13:
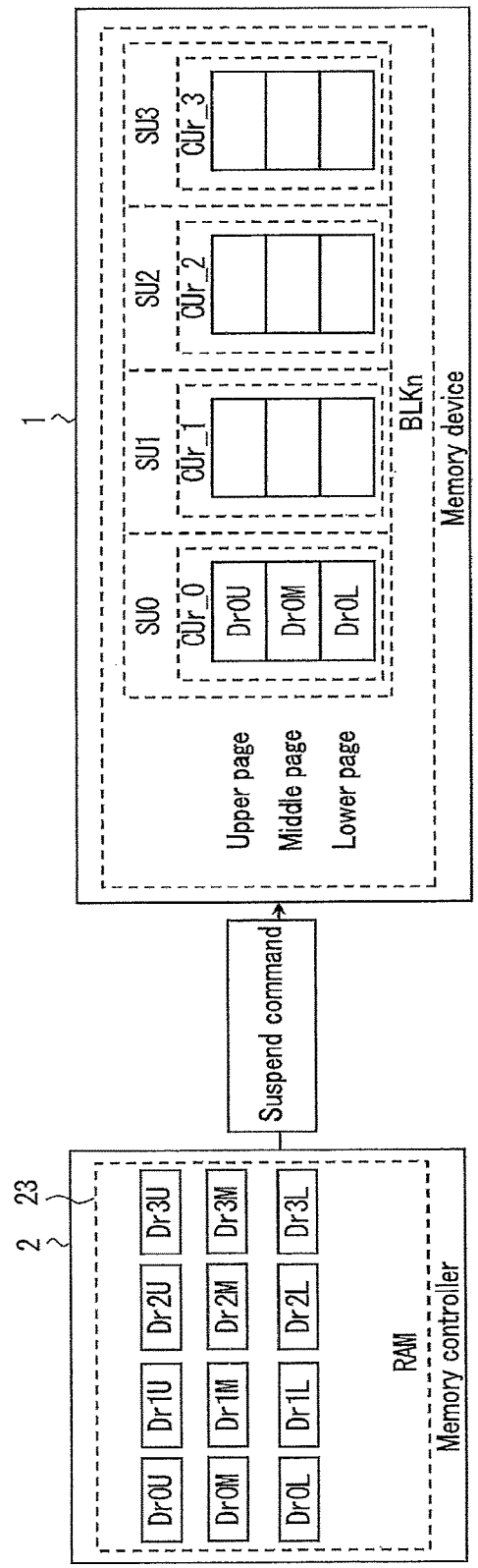
FIG. 13 illustrates a state of a part of the memory system during certain processing according to the second embodiment.

FIG. 13 illustrates a state of a part of the memory system 5 during step S24 according to the second embodiment. As illustrated in FIG. 13, since the suspend command has been received during the data writing to the cell unit CUr_1, the data writing to the cell unit CUr_1 has not been completed. In addition, the check read with respect to a cell unit CUr is incomplete at the time of the suspend. Accordingly, the memory controller 2 continues to store, in the RAM 23, write data to the cell unit CUr, in particular, at least write data Dr0L, Dr0M, and Dr0U to the cell unit CUr_0 in which the writing has been completed.

Figure 14:
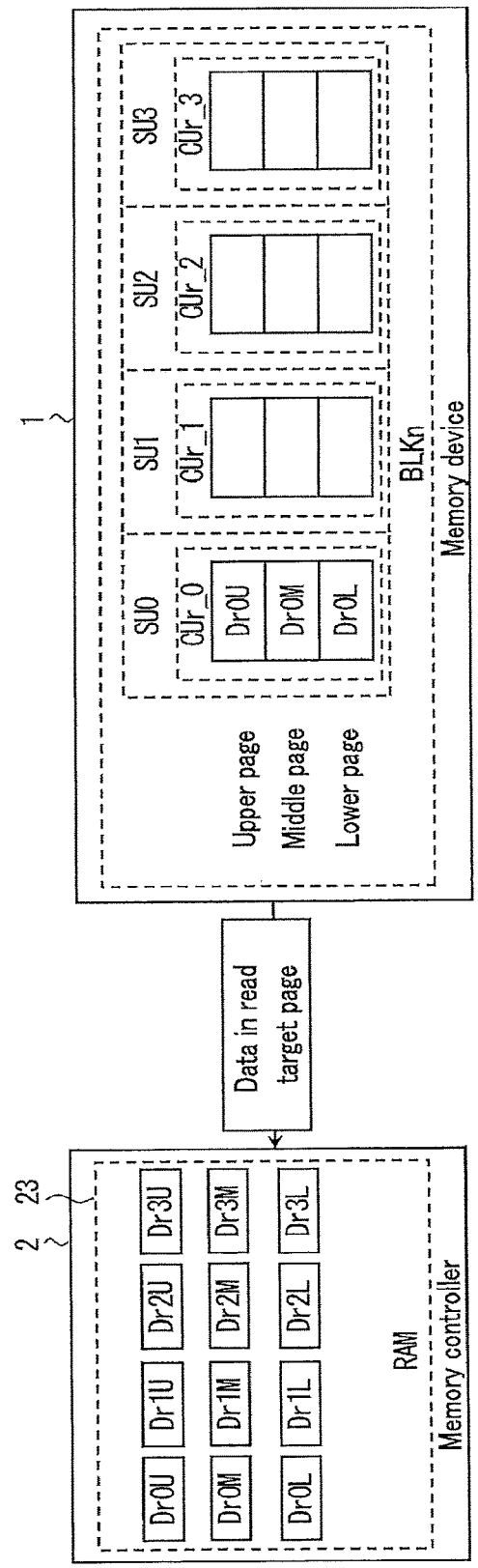
FIG. 14 illustrates another state of a part of the memory system during certain processing according to the second embodiment.

FIG. 14 illustrates a state of a part of the memory system 5 during step S26 according to the second embodiment. As illustrated in FIG. 14, the memory device 1 transmits, to the memory controller 2, the data that the memory device 1 has been instructed to read. Even at this point, the check read with respect to the cell unit CUr is incomplete. Accordingly, the memory controller 2 continues to store, in the RAM 23, write data to the cell unit CUr, in particular, at least write data Dr0L, Dr0M, and Dr0U to the cell unit CUr_0 in which the writing has been completed.

Figure 15:
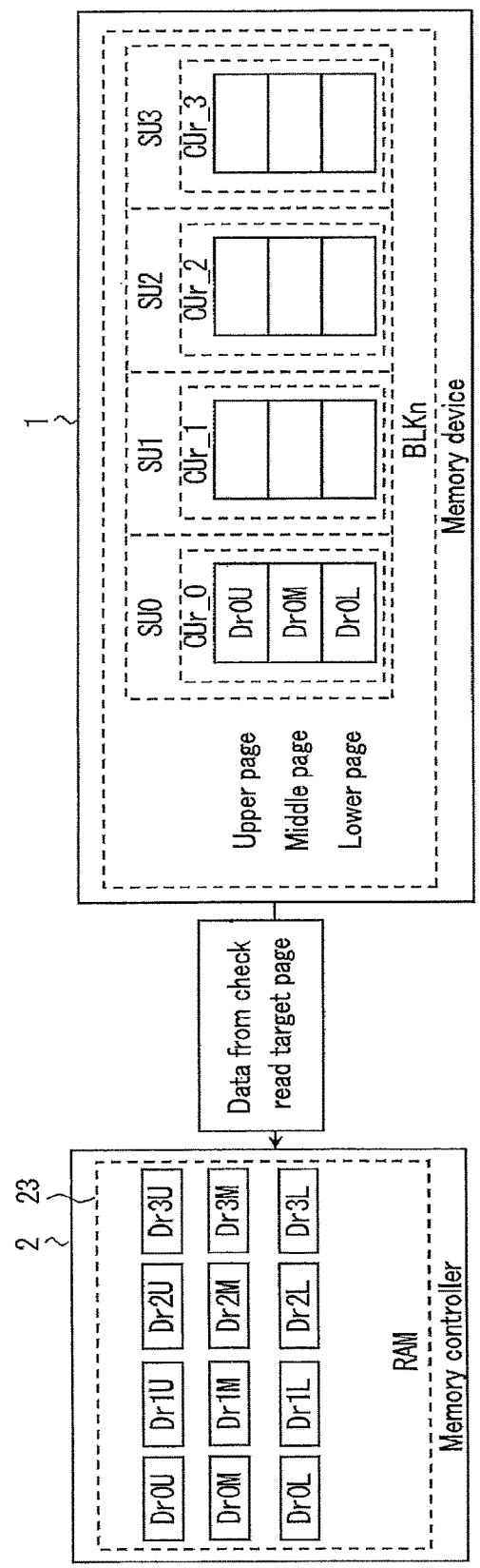
FIG. 15 illustrates another state of a part of the memory system during certain processing according to the second embodiment.

FIG. 15 illustrates a state of a part of the memory system 5 during step S12 according to the second embodiment. As illustrated in FIG. 15, the memory controller 2 reads data from one or more written pages from among the cell units CUr_0 to CUr_3 for the check read. Even at this point, the memory controller 2 continues to store, in the RAM 23, the write data to the cell unit CUr, in particular, at least the write data Dr0L, Dr0M, and Dr0U to the cell unit CUr_0 in which the writing has been completed.

According to the second embodiment, writing is suspended while write data is sequentially written to one or more cell units CUr_ s sharing a word line WL, and after data read, data is read from one or more pages of one or more cell units CUr_s in which the writing has been completed while the write data is stored by the memory controller 2, and it is determined whether the read data contains errors more than a certain reference as in the first embodiment. Therefore, the same advantage as in the first embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a memory device including;
  a bit line;
  a word line;
  a first string coupled to the bit line via a first transistor and including a first cell transistor; and
  a second string coupled to the bit line via a second transistor and including a second cell transistor, the second cell transistor and the first cell transistor being coupled to the word line; and
a controller configured to:
  instruct the memory device to write first data to the first cell transistor and to write second data to the second cell transistor; and
  instruct the memory device to read data from the first cell transistor while storing the first data and the second data after making the instruction for writing the first data and the second data.

2. The system according to claim 1, wherein:
the writing of the first data and the writing of the second data are instructed in an order of the writing of the first data and the writing of the second data.

3. The system according to claim 1, wherein:
the controller is configured to release an area storing the first data and the second data when a form of data read from the first cell transistor with no error contained is obtained.

4. The system according to claim 1, wherein:
a value of the first data is determined at least partly based on a distinction between a state in which data in the first cell transistor is erased and a state in which data is stored in the first cell transistor.

5. The system according to claim 1, wherein:
the memory device includes a first block and a second block,
the first block includes the first string and the second string, and
the controller is configured to copy data in the first block to the second block when an error contained in the data read from the first cell transistor is uncorrectable.

6. The system according to claim 5, wherein:
the controller is configured to register the first block as a bad block after copying the data in the first block to the second block.

7. The system according to claim 1, wherein:
the controller is configured to instruct, after making the instruction for writing the first data and the second data, the memory device to read data from the first cell transistor before making an instruction for reading data from the memory device and for writing data to the memory device.

8. The system according to claim 1, wherein:
the controller is configured to instruct the memory device to read data from the second cell transistor while storing the first data and the second data after making the instruction for writing the first data and the second data.

9. The system according to claim 8, wherein:
the controller is configured to release an area storing the first data and the second data when a form of data read from the first cell transistor with no error contained is obtained and a form of data read from the second cell transistor with no error contained is obtained.

10. The system according to claim 1, wherein:
the memory device includes the first to an x-th strings (x is a natural number equal to or more than three), the x-th string is coupled to the bit line via an x-th transistor and includes an x-th cell transistor, and the controller is configured to:
- instruct the memory device to write the first to x-th data to the first to the x-th cell transistors, respectively; and
- instruct the memory device to read data from the first cell transistor while storing the first data to the x-th data after making the instruction for writing the first to the x-th data.

11. The system according to claim 10, wherein:

the controller is configured to instruct, after determining that the writing of the first data to the x-th data has been completed, the memory device to execute first processing before making the instruction for reading data from the first cell transistor while storing the first data to the x-th data.

12. The system according to claim 11, wherein:

the controller is configured to store the first data to the x-th data during the first processing.

13. The system according to claim 10, wherein:

the memory device includes the first strings to the x-th strings in total in one block as strings coupled to the bit line.

14. The system according to claim 10, wherein:

the writing of the first data to the writing of the x-th data are instructed in an order of the writing of the first data to the writing of the x-th data.

15. The system according to claim 1, wherein:

the controller is configured to:
- make an instruction for suspending processing while the second data is being written after making the instruction for writing the first data and the second data; and
- transmit a command instructing the memory device to read data while storing the first data and the second data after making the instruction for suspending the processing.

16. The system according to claim 15, wherein:

the controller is configured to instruct the memory device to read data from the first cell transistor after receiving data instructed by the command.

* * * * *